United States Patent
Tsai et al.

(10) Patent No.: US 10,144,226 B1
(45) Date of Patent: Dec. 4, 2018

(54) DIGITAL INKJET FLATBED PRINTER HAVING SEPARATE LASER PROCESSING MACHINE

(71) Applicant: GREAT COMPUTER CORP., New Taipei (TW)

(72) Inventors: Chen-Chien Tsai, New Taipei (TW); Hui-Te Yu, New Taipei (TW)

(73) Assignee: GREAT COMPUTER CORPORATION, New Taipei (TW)

( * ) Notice: Subject to any disclaimer, the term of this patent is extended or adjusted under 35 U.S.C. 154(b) by 0 days.

(21) Appl. No.: 15/802,044

(22) Filed: Nov. 2, 2017

(51) Int. Cl.
| | | |
|---|---|---|
| B41J 3/44 | (2006.01) |
| B41M 5/00 | (2006.01) |
| B41J 11/66 | (2006.01) |
| B41J 29/06 | (2006.01) |
| B23K 26/38 | (2014.01) |
| B41C 1/00 | (2006.01) |
| B41J 3/407 | (2006.01) |
| B41J 3/00 | (2006.01) |
| B41J 3/413 | (2006.01) |
| B23K 26/00 | (2014.01) |
| B41M 5/24 | (2006.01) |
| B41C 1/10 | (2006.01) |
| B41C 1/05 | (2006.01) |
| G03F 7/20 | (2006.01) |

(Continued)

(52) U.S. Cl.
CPC ............... *B41J 3/44* (2013.01); *B23K 26/00* (2013.01); *B23K 26/38* (2013.01); *B41C 1/003* (2013.01); *B41C 1/05* (2013.01); *B41C 1/1008* (2013.01); *B41C 1/1033* (2013.01); *B41J 3/00* (2013.01); *B41J 3/407* (2013.01); *B41J 3/413* (2013.01); *B41J 3/445* (2013.01); *B41J 11/663* (2013.01); *B41J 29/06* (2013.01); *B41M 5/0047* (2013.01); *B41M 5/24* (2013.01); *G03F 7/2053* (2013.01); *B23K 26/50* (2015.10); *B41J 3/50* (2013.01)

(58) Field of Classification Search
CPC ... B41J 3/44; B41J 11/663; B41J 29/06; B41J 3/50; B41J 3/413; B41J 3/00; B41J 3/407; B41J 3/445; G03F 7/2053; B41C 1/1008; B41C 1/05; B41C 1/1033; B41C 1/003; B41M 5/24; B41M 5/0047; B23K 26/50; B23K 26/00; B23K 26/38
See application file for complete search history.

(56) References Cited

U.S. PATENT DOCUMENTS

2014/0277680 A1* 9/2014 Youngquist .......... B23K 1/0016
700/121

* cited by examiner

*Primary Examiner* — Justin Seo
(74) *Attorney, Agent, or Firm* — Muncy, Geissler, Olds & Lowe, P.C.

(57) ABSTRACT

A digital inkjet flatbed printer having a separate laser processing machine includes a laser processing machine and a digital inkjet printer. The laser processing machine is provided with a laser output module and a laser processing platform. The digital inkjet printer includes an inkjet output module and an inkjet operating platform. The inkjet operating platform is capable of movably ascending from and descending onto the digital inkjet printer. Thus, when the inkjet operating platform is descended, the laser processing machine is movably connected to the inkjet operating platform, such that the laser output module of the laser processing machine and the inkjet output module of the digital inkjet printer are on the laser processing platform of the laser processing machine and sequentially used for laser processing and inkjet printing respectively.

2 Claims, 4 Drawing Sheets

(51) Int. Cl.
*B23K 26/50* (2014.01)
*B41J 3/50* (2006.01)

DIGITAL INKJET FLATBED PRINTER HAVING SEPARATE LASER PROCESSING MACHINE

BACKGROUND OF THE INVENTION

Field of the Invention

The present invention relates to a digital inkjet flatbed printer having a separate laser processing machine, in which two machines can be independently used or integrally used.

Description of the Related Art

In laser processing industries, laser cutting and engraving processing technologies are a trendy processing technology that is being developed at a fast pace and extensively applied. Laser cutting and engraving processing technologies feature advantages of having a wide application range and high processing precision, being insusceptible to damaging processed workpieces, easy to control and reliable, and providing high processing efficiency and good engraving quality.

For the printing industry, inkjet products are a world trend. For diversified products in small quantities, finished products can be quickly acquired by printing of inkjet printers in real time, reducing the time and operation needed for manufacturing color separation screens and thus providing a greater advantage in the competitive era. More specifically, using an inkjet printer, colors in different concentrations can be sprayed to the same position by using differently colored inks to produce intended colors, hence providing printing quality that is similar to that of photographs.

However, in commercially available solutions, two different types of machines are respectively required for laser processing and inkjet printing, and a mutual integration of the two is unavailable. Thus, in implementation, in addition to relocating a workpiece, the workpieces also needs to be again aligned and calibrated, causing operation inconveniences.

SUMMARY OF THE INVENTION

The present invention is directed to a digital laser flat printer having a separate laser processing machine, in which two machines can be independently used or integrally used.

To achieve the object, a digital inkjet flatbed printer having a separate laser processing machine provided by the present invention includes a laser processing machine and a digital inkjet printer. The laser processing machine is provided with a laser output module and a laser processing platform, such that an object to be processed can be placed on the laser processing platform and be processed by laser from the laser output module. The digital inkjet printer includes an inkjet output module and an inkjet operating platform, so as to place an object to be printed d on the inkjet operating platform and printed by the inkjet output module. The inkjet operating platform is capable of movably ascending from and descending onto the digital inkjet printer. Thus, when the inkjet operating platform is descended, the laser processing machine can be movably connected to the inkjet operating platform. As such, the laser output module of the laser processing machine and the inkjet output module of the digital inkjet printer are on the laser processing platform of the laser processing machine and sequentially used for laser processing and inkjet printing.

In implementation, the digital inkjet printer further includes a control module, and the laser processing machine is connected to the control module of the digital inkjet printer via a signal cable. Accordingly, the laser output module of the laser processing machine and the inkjet output module of the digital inkjet printer are controlled via the control module to sequentially operate.

To better understand the present invention, the substantial contents and expected effects of the invention are described in detail in the non-limiting embodiments below with reference to the accompanying drawings and denotations.

DETAILED DESCRIPTION OF THE INVENTION

FIG. 1 to FIG. 4 show an embodiment of a digital inkjet flatbed printer having a separate laser processing machine according to an embodiment of the present invention. The digital inkjet flatbed printer includes a laser processing machine 1 and a digital inkjet printer 2.

Figure 1:
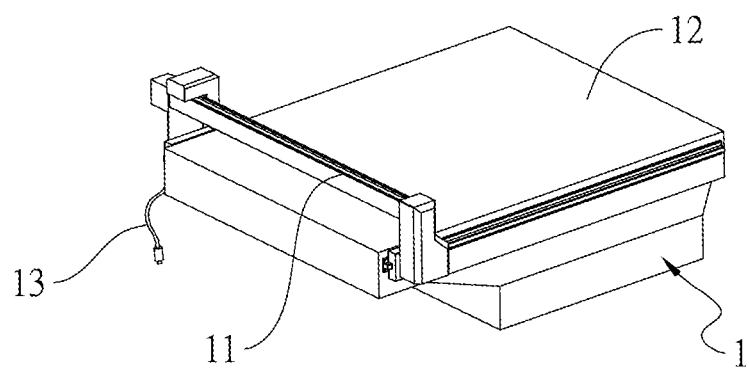
FIG. 1 is an appearance schematic diagram of a laser processing machine according to an embodiment of the present invention.

As shown in FIG. 1, the laser processing machine 1 is provided with a laser output module 11 and a laser processing platform 12, so as to place an object to be processed by laser on the laser processing platform 12 and be processed by the laser output module 11.

Figure 2:
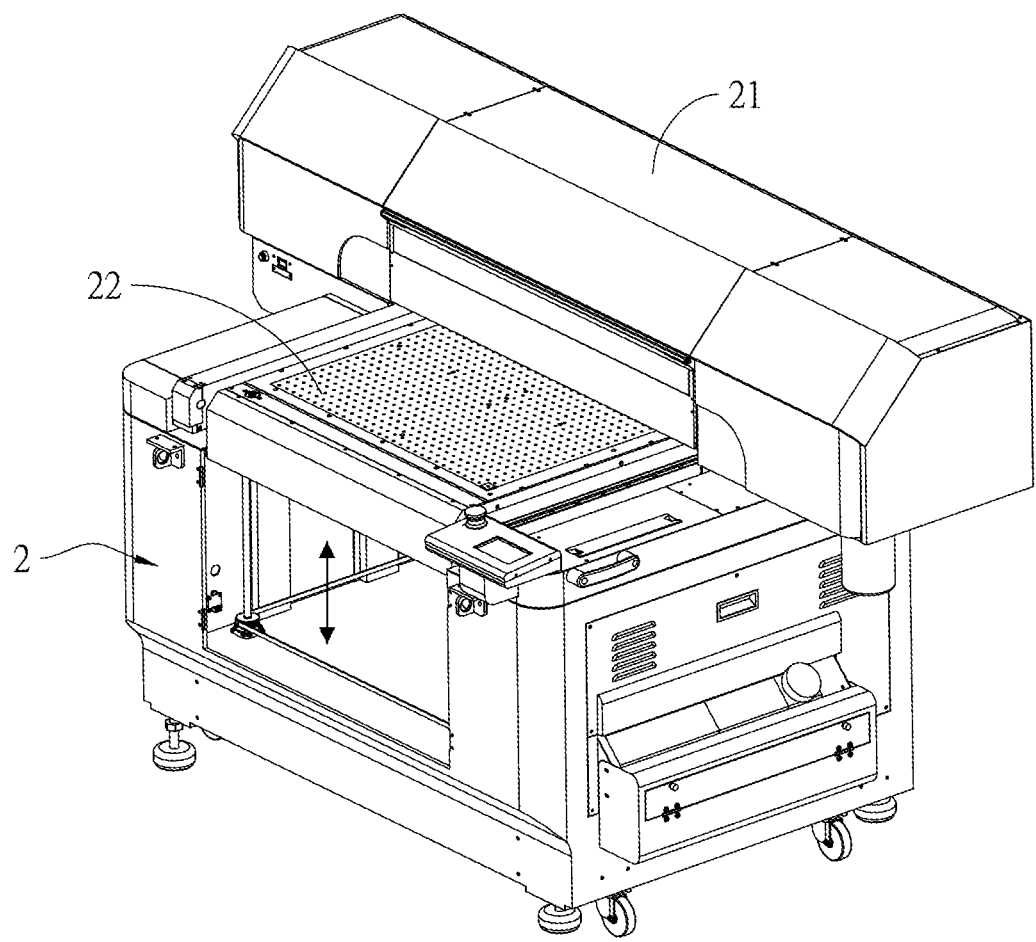
FIG. 2 is an appearance schematic diagram of a digital inkjet printer according to an embodiment of the present invention.

As shown in FIG. 2, the digital inkjet printer 2 includes an inkjet output module 21 and an inkjet operating platform 22, so as to place an object to be printed t on the inkjet operating platform 22 and be printed by the inkjet output module 21.

Figure 3:
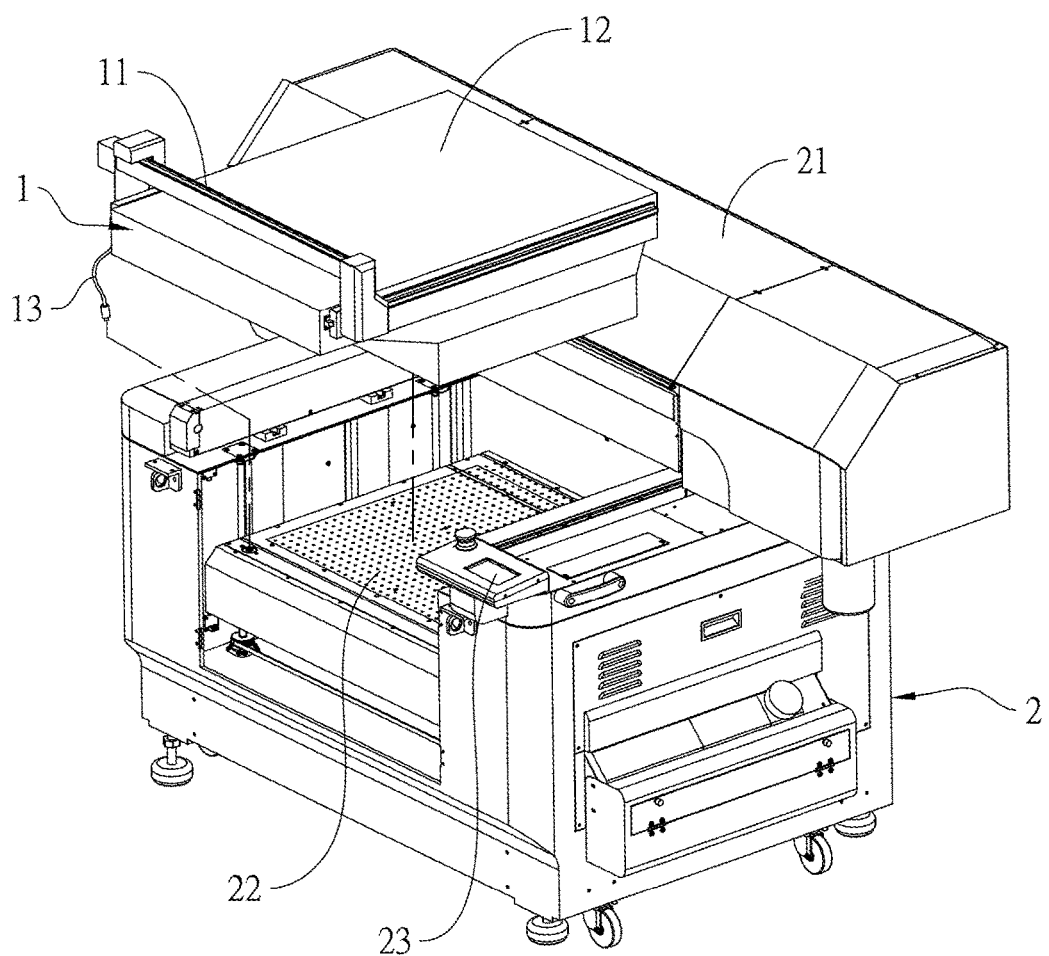
FIG. 3 is a schematic diagram showing a laser processing machine and a digital inkjet printer that are not connected with each other according to an embodiment of the present invention.
Figure 4:
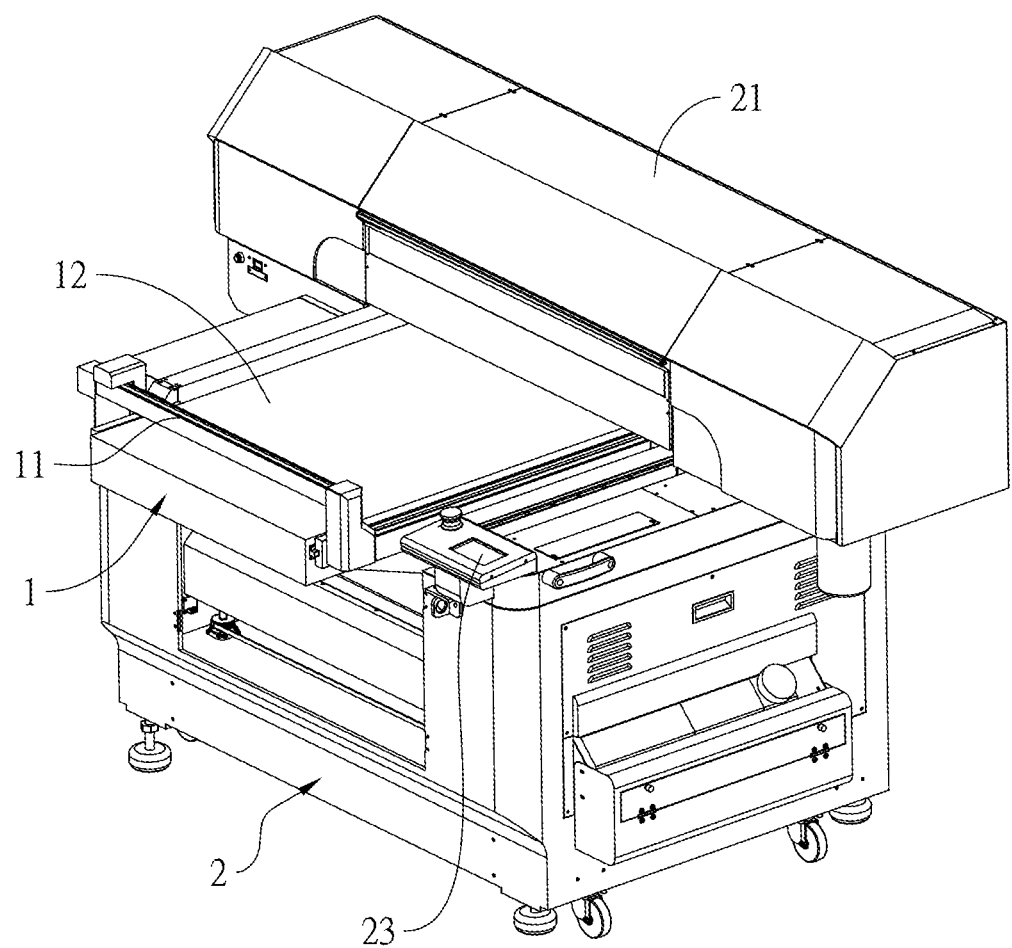
FIG. 4 is a schematic diagram showing a laser processing machine and a digital inkjet printer that are connected with each other according to an embodiment of the present invention.

As shown in FIG. 3, the inkjet operating platform 22 can movably ascending from and descending onto the digital laser machine 2. Thus, when the inkjet operating platform 22 is descended, the laser processing machine 1 can be movably connected to the inkjet operating platform 22.

In implementation, when the laser processing machine 1 is connected to the inkjet operating platform 21, the laser output module 11 of the laser processing machine 1 and the inkjet output module 21 of the digital inkjet printer 2 are on the laser processing platform 12 of the laser processing machine 1 and sequentially used for laser processing and inkjet printing respectively.

The digital inkjet printer 2 further includes a control module 23, and the laser processing machine 1 may be electrically connected to the control module 23 of the digital inkjet printer 2 via a signal cable. Thus, via the control module 23, the laser output module 11 of the laser processing machine 1 and the inkjet output module 21 of the digital inkjet printer 2 may be controlled to sequentially operate.

Therefore, the present invention provides following advantages.

1. When the laser processing machine and the digital inkjet printer are connected, laser processing and inkjet printing would share the laser processing platform of the laser processing machine to perform processing procedures, thus eliminating the issue of alignment and calibration and significantly enhancing working efficiency and product precision.

2. The laser processing machine and the digital inkjet printer of the present invention can be connected to jointly operate, or the two may be separated to perform their independent operations, thus significantly increasing the utilization of machines and reducing risks of leaving malfunctioning machines idle.

The above description discloses embodiments and technical means of the present invention. Variations and modifications made based on the disclosure or teaching of the application are regarded as equivalences of the concept of the present invention. These variations and modifications, without departing from the substantial spirit of the present invention, are to be encompassed within the technical scope of the present invention.

In conclusion, according to the above disclosure, the present invention provides a digital inkjet flatbed printer having a separate laser processing machine offering practical and industrial values, and achieves expected effects.

What is claimed is:

1. A digital inkjet flatbed printer having a separate laser processing machine, comprising:

a laser processing machine, provided with a laser output module and a laser processing platform, so as to place an object to be processed on the laser processing platform for being processed by laser from the laser output module; and a digital inkjet printer, having an inkjet output module and an inkjet operating platform, so as to place an object to be printed on the inkjet operating platform for being printed by the inkjet output module;

wherein, the inkjet operating platform is capable of movably ascending towards and descending from the inkjet output module; when the inkjet operating platform is descended, the laser processing machine is movably connected to the inkjet operating platform, such that the laser output module of the laser processing machine and the inkjet output module of the digital inkjet printer both use the laser processing platform of the laser processing machine and are sequentially used for laser processing and inkjet printing respectively.

2. The digital inkjet flatbed printer having a separate laser processing machine according to claim 1, wherein the digital inkjet printer further comprises a control module, and the laser processing machine is connected to the control module of the digital inkjet printer via a signal cable, such that the laser output module of the laser processing machine and the inkjet output module of the digital inkjet printer are controlled via the control module to sequentially operate.

\* \* \* \* \*